US006277477B1

(12) United States Patent
Tracy et al.

(10) Patent No.: US 6,277,477 B1
(45) Date of Patent: Aug. 21, 2001

(54) RECORDING SHEET FOR USE WITH AQUEOUS INKS

(75) Inventors: Mark D. Tracy, Rochester; Timothy J. Fuller, Pittsford, both of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/276,242

(22) Filed: Mar. 25, 1999

(51) Int. Cl.[7] ................................ B32B 3/00; B05D 5/00; G11C 17/06

(52) U.S. Cl. ............................................ 428/195; 427/105

(58) Field of Search ............................ 428/175; 427/256; 347/156

(56) References Cited

U.S. PATENT DOCUMENTS 4,137,364 * 1/1979 Ball, II et al. ....................... 428/412
4,239,826 * 12/1980 Knott, II et al. ...................... 428/35

FOREIGN PATENT DOCUMENTS

363813 * 4/1990 (EP) ................................ C08F/8/12
55-129469 * 10/1980 (JP) ............................ C08F/210/02
10-095917 * 4/1990 (JP) ................................ C08L/29/04

* cited by examiner

*Primary Examiner*—Bruce H. Hess
*Assistant Examiner*—Michael E. Grendzynsk
(74) *Attorney, Agent, or Firm*—Judith L. Byorick

(57) ABSTRACT

Disclosed is a recording sheet which comprises a substrate and an image-receiving coating situated on at least one surface of the substrate, said image-receiving coating being suitable for receiving images of an aqueous ink, said image-receiving coating comprising a poly(ethylene-vinyl alcohol-vinyl acetate) terpolymer, said terpolymer containing ethylene repeat units in an amount of from about 5 to about 20 mole percent, vinyl alcohol repeat units in an amount of from about 70 to about 85 mole percent, and vinyl acetate repeat units in an amount of from about 5 to about 20 mole percent.

21 Claims, No Drawings

RECORDING SHEET FOR USE WITH AQUEOUS INKS

BACKGROUND OF THE INVENTION

The present invention is directed to recording sheets for receiving printed images. More specifically, the present invention is directed to recording sheets particularly suitable for use with aqueous inks. One embodiment of the present invention is directed to a recording sheet which comprises a substrate and an image-receiving coating situated on at least one surface of the substrate, said image-receiving coating being suitable for receiving images of an aqueous ink, said imager-eceiving coating comprising a poly(ethylene-vinyl alcohol-vinyl acetate) terpolymer, said terpolymer containing ethylene repeat units in an amount of from about 5 to about 20 mole percent, vinyl alcohol repeat units in an amount of from about 70 to about 85 mole percent, and vinyl acetate repeat units in an amount of from about 5 to about 20 mole percent.

Ink jet printing systems generally are of two types: continuous stream and drop-on-demand. In continuous stream ink jet systems, ink is emitted in a continuous stream under pressure through at least one orifice or nozzle. The stream is perturbed, causing it to break up into droplets at a fixed distance from the orifice. At the break-up point, the droplets are charged in accordance with digital data signals and passed through an electrostatic field which adjusts the trajectory of each droplet in order to direct it to a gutter for recirculation or a specific location on a recording medium. In drop-on-demand systems, a droplet is expelled from an orifice directly to a position on a recording medium in accordance with digital data signals. A droplet is not formed or expelled unless it is to be placed on the recording medium.

Since drop-on-demand systems require no ink recovery, charging, or deflection, the system is much simpler than the continuous stream type. There are two types of drop-on-demand ink jet systems. One type of drop-on-demand system has as its major components an ink filled channel or passageway having a nozzle on one end and a piezoelectric transducer near the other end to produce pressure pulses. The relatively large size of the transducer prevents close spacing of the nozzles, and physical limitations of the transducer result in low ink drop velocity. Low drop velocity seriously diminishes tolerances for drop velocity variation and directionality, thus impacting the system's ability to produce high quality copies. Drop-on-demand systems which use piezoelectric devices to expel the droplets also suffer the disadvantage of a slow printing speed.

Another type of drop-on-demand system is known as thermal ink jet, or bubble jet, and produces high velocity droplets and allows very close spacing of nozzles. The major components of this type of drop-on-demand system are an ink filled channel having a nozzle on one end and a heat generating resistor near the nozzle. Printing signals representing digital information originate an electric current pulse in a resistive layer within each ink passageway near the orifice or nozzle, causing the ink in the immediate vicinity to evaporate almost instantaneously and create a bubble. The ink at the orifice is forced out as a propelled droplet as the bubble expands. When the hydrodynamic motion of the ink stops, the process is ready to start all over again. With the introduction of a droplet ejection system based upon thermally generated bubbles, commonly referred to as the "bubble jet" system, the dropon-demand ink jet printers provide simpler, lower cost devices than their continuous stream counterparts, and yet have substantially the same high speed printing capability.

The operating sequence of the bubble jet system begins with a current pulse through the resistive layer in the ink filled channel, the resistive layer being in close proximity to the orifice or nozzle for that channel. Heat is transferred from the resistor to the ink. The ink becomes superheated far above its normal boiling point, and for water based ink, finally reaches the critical temperature for bubble formation or nucleation of around 280° C. Once nucleated, the bubble or water vapor thermally isolates the ink from the heater and no further heat can be applied to the ink. This bubble expands until all the heat stored in the ink in excess of the normal boiling point diffuses away or is used to convert liquid to vapor, which removes heat due to heat of vaporization. The expansion of the bubble forces a droplet of ink out of the nozzle, and once the excess heat is removed, the bubble collapses on the resistor. At this point, the resistor is no longer being heated because the current pulse has passed and, concurrently with the bubble collapse, the droplet is propelled at a high rate of speed in a direction towards a recording medium. The resistive layer encounters a severe cavitational force by the collapse of the bubble, which tends to erode it. Subsequently, the ink channel refills by capillary action. This entire bubble formation and collapse sequence occurs in about 10 microseconds. The channel can be refired after 100 to 500 microseconds minimum dwell time to enable the channel to be refilled and to enable the dynamic refilling factors to become somewhat dampened. Thermal ink jet processes are well known and are described in, for example, U.S. Pat. No. 4,601,777, U.S. Pat. No. 4,251,824, U.S. Pat. No. 4,410,899, U.S. Pat. No. 4,412,224, and U.S. Pat. No. 4,532,530, the disclosures of each of which are totally incorporated herein by reference.

Acoustic ink jet printing processes are also known. As is known, an acoustic beam exerts a radiation pressure against objects upon which it impinges. Thus, when an acoustic beam impinges on a free surface (i.e., liquid/air interface) of a pool of liquid from beneath, the radiation pressure which it exerts against the surface of the pool may reach a sufficiently high level to release individual droplets of liquid from the pool, despite the restraining force of surface tension. Focusing the beam on or near the surface of the pool intensifies the radiation pressure it exerts for a given amount of input power. These principles have been applied to prior ink jet and acoustic printing proposals. For example, K. A. Krause, "Focusing Ink Jet Head," *IBM Technical Disclosure Bulletin*, Vol. 16, No. 4, September 1973, pp. 1168–1170, the disclosure of which is totally incorporated herein by reference, describes an ink jet in which an acoustic beam emanating from a concave surface and confined by a conical aperture was used to propel ink droplets out through a small ejection orifice. Acoustic ink printers typically comprise one or more acoustic radiators for illuminating the free surface of a pool of liquid ink with respective acoustic beams. Each of these beams usually is brought to focus at or near the surface of the reservoir (i.e., the liquid/air interface). Furthermore, printing conventionally is performed by independently modulating the excitation of the acoustic radiators in accordance with the input data samples for the image that is to be printed. This modulation enables the radiation pressure which each of the beams exerts against the free ink surface to make brief, controlled excursions to a sufficiently high pressure level for overcoming the restraining force of surface tension. That, in turn, causes individual droplets of ink to be ejected from the free ink surface on demand at an adequate velocity to cause them to deposit in an image configuration on a nearby recording medium. The acoustic beam may be intensity modulated or focused/defocused to control the ejection timing, or an external source may be used to extract droplets from the acoustically excited liquid on the surface of the pool on demand. Regardless of the timing mechanism employed, the size of the ejected droplets is determined by the waist diameter of the focused acoustic beam. Acoustic ink printing is attractive because it does not require the nozzles or the small ejection orifices which have caused many of the reliability and pixel placement accuracy problems that conventional drop on demand and continuous stream ink jet printers have suffered. The size of the ejection orifice is a critical design parameter of an ink jet because it determines the size of the droplets of ink that the jet ejects. As a result, the size of the ejection orifice cannot be increased, without sacrificing resolution. Acoustic printing has increased intrinsic reliability because there are no nozzles to clog. As will be appreciated, the elimination of the clogged nozzle failure mode is especially relevant to the reliability of large arrays of ink ejectors, such as page width arrays comprising several thousand separate ejectors. Furthermore, small ejection orifices are avoided, so acoustic printing can be performed with a greater variety of inks than conventional ink jet printing, including inks having higher viscosities and inks containing pigments and other particulate components. It has been found that acoustic ink printers embodying printheads comprising acoustically illuminated spherical focusing lenses can print precisely positioned pixels (i.e., picture elements) at resolutions which are sufficient for high quality printing of relatively complex images. It has also has been discovered that the size of the individual pixels printed by such a printer can be varied over a significant range during operation, thereby accommodating, for example, the printing of variably shaded images. Furthermore, the known droplet ejector technology can be adapted to a variety of printhead configurations, including (1) single ejector embodiments for raster scan printing, (2) matrix configured ejector arrays for matrix printing, and (3) several different types of pagewidth ejector arrays, ranging from single row, sparse arrays for hybrid forms of parallel/serial printing to multiple row staggered arrays with individual ejectors for each of the pixel positions or addresses within a pagewidth image field (i.e., single ejector/pixel/line) for ordinary line printing. Inks suitable for acoustic ink jet printing typically are liquid at ambient temperatures (i.e., about 25° C.), but in other embodiments the ink is in a solid state at ambient temperatures and provision is made for liquefying the ink by heating or any other suitable method prior to introduction of the ink into the printhead. Images of two or more colors can be generated by several methods, including by processes wherein a single printhead launches acoustic waves into pools of different colored inks. Further information regarding acoustic ink jet printing apparatus and processes is disclosed in, for example, U.S. Pat. No. 4,308,547, U.S. Pat. No. 4,697,195, U.S. Pat. No. 5,028,937, U.S. Pat. No. 5,041,849, U.S. Pat. No. 4,751,529, U.S. Pat. No. 4,751,530, U.S. Pat. No. 4,751,534, U.S. Pat. No. 4,801,953, and U.S. Pat. No. 4,797,693, the disclosures of each of which are totally incorporated herein by reference. The use of focused acoustic beams to eject droplets of controlled diameter and velocity from a free-liquid surface is also described in *J. AppL Phys*., vol. 65, no. 9 (May 1, 1989) and references therein, the disclosure of which is totally incorporated herein by reference.

While known compositions and processes are suitable for their intended purposes, a need remains for improved recording sheets suitable for use with aqueous inks. In addition, a need remains for recording sheets suitable for use in ink jet printing processes. Further, a need remains for recording sheets suitable for receiving images of aqueous inks with substantially different surface tensions. Additionally, a need remains for transparent recording sheets with good projection efficiency. There is also a need for recording sheets with desirable drying properties when printed with aqueous inks having varying surface tensions. In addition, there is a need for recording sheets that exhibit reduced or substantially no intercolor bleed when imaged with aqueous inks. Further, there is a need for recording sheets that exhibit reduced or substantially no feathering when imaged with aqueous inks. Additionally, there is a need for recording sheets that exhibit reduced or substantially no smearing when imaged with aqueous inks. A need also remains for recording sheets which, when imaged with aqueous inks having dye colorants, exhibit reduced or substantially no crystallization of the dyes. In addition, a need remains for recording sheets that enable desirable spot sizes when used in ink jet printing processes employing aqueous inks. Further, a need remains for recording sheets that enable production of high quality solid areas in images generated thereon with aqueous inks. Additionally, a need remains for recording sheets that exhibit reduced or no coalescence in solid areas or other areas when imaged with aqueous inks. Coalescence occurs when the ink-recording sheet interaction is hydrophobic in nature. The ink tends to bead and then coalesce instead of spreading uniformly on the recording sheet. There is also a need for recording sheets having ink receiving coatings that do not crystallize on the substrate; such crystallization can produce haze in a transparent recording sheet. In addition, there is a need for recording sheets having ink receiving coatings that adhere well to the substrate. Further, there is a need for recording sheets having ink receiving coatings of a material that produces coatings with good film characteristics. Additionally, there is a need for recording sheets that enable the production of lightfast and waterfast images thereon when imaged with an aqueous ink. A need also remains for recording sheets that are scuff resistant.

SUMMARY OF THE INVENTION

The present invention is directed to a recording sheet which comprises a substrate and an image-receiving coating situated on at least one surface of the substrate, said image-receiving coating being suitable for receiving images of an aqueous ink, said image-receiving coating comprising a poly(ethylene-vinyl alcohol-vinyl acetate) terpolymer, said terpolymer containing ethylene repeat units in an amount of from about 5 to about 20 mole percent, vinyl alcohol repeat units in an amount of from about 70 to about 85 mole percent, and vinyl acetate repeat units in an amount of from about 5 to about 20 mole percent.

DETAILED DESCRIPTION OF THE INVENTION

The present invention is directed to a recording sheet comprising a substrate and an image-receiving layer. The substrate can be either transparent or opaque. Any suitable transparent substrate can be employed. Examples include transparent materials, such as polyester, including Mylar™, available from E.I. Du Pont de Nemours & Company, Melinex™, available from Imperial Chemicals, Inc., Celanar™, available from Celanese Corporation, polyethylene naphthalates, such as Kaladex PEN Films, available from Imperial Chemicals, Inc., polycarbonates such as Lexan™, available from General Electric Company, polysulfones, such as those available from Union Carbide Corporation, polyether sulfones, such as those prepared from 4,4'-diphenyl ether, such as Udel™, available from Union Carbide Corporation, those prepared from disulfonyl chloride, such as Victrex™, available from ICI America Incorporated, those prepared from biphenylene, such as Astrel™, available from 3M Company, poly (arylene sulfones), such as those prepared from crosslinked poly (arylene ether ketone sulfones), cellulose triacetate, polyvinylchloride cellophane, polyvinyl fluoride, polyimides, and the like, with polyester such as Mylar™ being preferred in view of its availability and relatively low cost.

The substrate can also be opaque, including opaque plastics, such as Teslin™, available from PPG Industries, and filled polymers, such as Meline®, available from ICI. Filled plastics can also be employed as the substrate, particularly when it is desired to make a "never-tear paper" recording sheet. Paper is also suitable, including plain papers such as Xerox® 4024, diazo papers, or the like, and coated or glossy papers for special applications, such as photo quality printing.

In one embodiment of the present invention, the substrate comprises sized blends of hardwood kraft and softwood kraft fibers containing from about 10 to 90 percent by weight soft wood and from about 10 to about 90 percent by weight hardwood. Examples of hardwood include Seagull W dry bleached hardwood kraft, present in one embodiment in an amount of about 70 percent by weight. Examples of softwood include La Tuque dry bleached softwood kraft, present in one embodiment in an amount of about 30 percent by weight. These substrates can also contain fillers and pigments in any effective amounts, typically from about 1 to about 60 percent by weight, such as clay (available from Georgia Kaolin Company, Astro-fil 90 clay, Engelhard Ansilex clay), titanium dioxide (available from Tioxide Company—Anatase grade AHR), calcium silicate CH-427-97-8, XP-974 (J.M. Huber Corporation), and the like. The sized substrates can also contain sizing chemicals in any effective amount, typically from about 0.25 percent to about 25 percent by weight of pulp, such as acidic sizing, including Mon size (available from Monsanto Company), alkaline sizing such as Hercon-76 (available from Hercules Company), Alum (available from Allied Chemicals as Iron free alum), retention aid (available from Allied Colloids as Percol 292), and the like. The preferred internal sizing degree of papers selected for the present invention, including commercially available papers, varies from about 0.4 to about 5,000 seconds, and papers in the sizing range of from about 0.4 to about 300 seconds are more preferred, primarily to decrease costs. Preferably, the selected substrate is porous, and the porosity value of the selected substrate preferably varies from about 100 to about 1,260 milliliters per minute and preferably from about 50 to about 600 milliliters per minute to enhance the effectiveness of the recording sheet in ink jet processes. Preferred basis weights for the substrate are from about 40 to about 400 grams per square meter, although the basis weight can be outside of this range.

Illustrative examples of commercially available internally and externally (surface) sized substrates suitable for the present invention include Diazo papers, offset papers, such as Great Lakes offset, recycled papers, such as Conservatree, office papers, such as Automimeo, Eddy liquid toner paper and copy papers available from companies such as Nekoosa, Champion, Wiggins Teape, Kymmene, Modo, Domtar, Veitsiluoto and Sanyo, and the like, with Xerox® 4024™ papers and sized calcium silicate-clay filled papers being particularly preferred in view of their availability, reliability, and low print through. Pigmented filled plastics, such as Teslin (available from PPG industries), are also preferred as supporting substrates.

The substrate can be of any effective thickness. Typical thicknesses for the substrate are from about 50 to about 500 microns, and preferably from about 100 to about 125 microns, although the thickness can be outside these ranges.

The image-receiving layer comprises a terpolymer of ethylene, vinyl alcohol, and vinyl acetate. Typically, the terpolymer contains ethylene repeat units in an amount of from about 5 to about 20 mole percent, vinyl alcohol repeat units in an amount of from about 70 to about 85 mole percent, and vinyl acetate repeat units in an amount of from about 5 to about 20 mole percent. Preferably, the terpolymer contains ethylene repeat units in an amount of from about 10 to about 13 mole percent, vinyl alcohol repeat units in an amount of from about 75 to about 80 mole percent, and vinyl acetate repeat units in an amount of from about 10 to about 12 mole percent, although the relative amounts of monomers can be outside of these ranges. The terpolymer is of the general formula

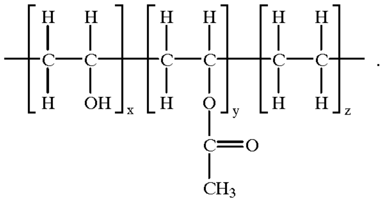

wherein x, y, and z are integers representing the number of repeat monomer units, and have relative values with respect to each other such that the terpolymer has the indicated mole percentages of each monomer. While not being limited to any particular theory, it is believed that preferred polymers for the present invention are random terpolymers.

The terpolymer typically has a weight average molecular weight (Mw) of from about 2,000 to about 300,000, preferably from about 10,000 to about 80,000, and more preferably from about 15,000 to about 60,000, although the weight average molecular weight can be outside of these ranges. The terpolymer typically has a number average molecular weight ($M_n$) of from about 2,000 to about 100,000, preferably from about 10,000 to about 80,000, and more preferably from about 10,000 to about 30,000, although the number average molecular weight can be outside of these ranges. The terpolymer typically has a polydispersity ($M_w/M_n$) of from about 1 to about 50, preferably from about 1 to about 10, and more preferably from about 1 to about 5, although the polydispersity can be outside of these ranges.

Suitable poly(ethylene-vinyl alcohol-vinyl acetate) terpolymers can be prepared by, for example, high pressure free radical polymerization of ethylene with vinyl acetate in a suitable solvent, such as water, benzene, toluene, cyclohexane, or the like, to form a poly(ethylene-vinyl acetate) copolymer, followed by hydrolysis of the poly (ethylene-vinyl acetate) copolymer to obtain a poly (ethylene-vinyl alcohol-vinyl acetate) terpolymer.

While not being limited to any particular theory, it is believed that the image receiving coating comprising the poly(ethylene-vinyl alcohol-vinyl acetate) terpolymer enables the printing of different colored inks having markedly different surface tensions and cosolvent compositions without image defects such as intercolor bleed, feathering, smearing, coalescence, or crystallization of the dyes. Ink sets selected for multicolor ink jet printing processes often include inks of different composition and characteristics. For example, the black ink of a color ink set may be relatively slow drying and predominantly water based, containing a relatively low amount of organic cosolvents, whereas a colored ink (cyan, magenta, yellow, red, green, or the like) of the color set may be relatively fast drying and contain a relatively high amount of organic cosolvents. Inks of varying compositions may also exhibit markedly different surface tensions. For example, the difference in surface tension between two different colored inks in a colored ink set can be from 0 to about 25 dynes per centimeter. Particularly on transparency recording sheets, image defects observed for inks having relatively high surface tensions (typically from about 45 to about 55 dynes per centimeter) typically result from coalescence, whereas image defects observed for inks having relatively low surface tensions (typically from about 30 to about 40 dynes per centimeter) typically result from small spot size. High coalescence can cause image defects such as splotchy appearance, whereas small spot size can cause image defects such as streaky solids. Recording sheets having image receiving coatings according to the present invention, however, enable relatively high surface tension inks to form high quality images with reduced coalescence, and also enable relatively low surface tension inks to form high quality images with desirable spot size.

The image receiving coating layer is present on the substrate of the recording sheet of the present invention in any effective thickness. Typically, the total thickness of the image receiving coating layer (on each surface, when both sides of the substrate are coated) is from about 1 to about 25 microns and preferably from about 5 to about 10 microns, although the thickness can be outside of these ranges. Typically, the image receiving coating layer (on each surface, when both sides of the substrate are coated) is present on the substrate in an amount of from about 2.5 to about 25 grams per square meter, and preferably from about 5 to about 10 grams per square meter, although the amount can be outside of these ranges.

If desired, additional layers can be present in the recording sheet, such as layers situated between the substrate and the image-receiving layer, protective overcoatings situated so that the image-receiving layer is between the substrate and the overcoating, antistatic layers, anticurl layers, or the like.

The coating or coatings can be applied to the substrate by any suitable technique. For example, the layer coatings can be applied by a number of known techniques, such as size press treatment, dip coating, reverse roll coating, extrusion coating, or the like. For example, the coating can be applied with a KRK size press (Kumagai Riki Kogyo Co., Ltd., Nerima, Tokyo, Japan) by dip coating and can be applied by solvent extrusion on a Faustel Coater. The KRK size press is a lab size press that simulates a commercial size press. This size press is normally sheet fed, whereas a commercial size press typically employs a continuous web. On the KRK size press, the substrate sheet is taped by one end to the carrier mechanism plate. The speed of the test and the roll pressures are set, and the coating solution is poured into the solution tank. A 4 liter stainless steel beaker is situated underneath for retaining the solution overflow. The coating solution is cycled once through the system (without moving the substrate sheet) to wet the surface of the rolls and then returned to the feed tank, where it is cycled a second time. While the rolls are being “wetted”, the sheet is fed through the sizing rolls by pressing the carrier mechanism start button. The coated sheet is then removed from the carrier mechanism plate and is placed on a 12 inch by 40 inch sheet of 750 micron thick Teflon for support and is dried on the Dynamic Former drying drum and held under restraint to prevent shrinkage. The drying temperature is approximately 105° C. This method of coating treats both sides of the substrate simultaneously.

In dip coating, a web of the material to be coated is transported below the surface of the liquid coating composition by a single roll in such a manner that the exposed site is saturated, followed by removal of any excess coating by the squeeze rolls and drying at 100° C. in an air dryer. The liquid coating composition generally comprises the desired coating composition dissolved in a solvent such as water, methanol, or the like. The method of surface treating the substrate using a coater results in a continuous sheet of substrate with the coating material applied first to one side and then to the second side of this substrate. The substrate can also be coated by a slot extrusion process, wherein a flat die is situated with the die lips in close proximity to the web of substrate to be coated, resulting in a continuous film of the coating solution evenly distributed across one surface of the sheet, followed by drying in an air dryer at 100° C.

Recording sheets of the present invention can be employed in ink jet printing processes. One embodiment of the present invention is directed to a process which comprises applying an aqueous recording liquid to a recording sheet of the present invention in an imagewise pattern. Another embodiment of the present invention is directed to a printing process which comprises (1) incorporating into an ink jet printing apparatus containing an aqueous ink a recording sheet of the present invention, and (2) causing droplets of the ink to be ejected in an imagewise pattern onto the recording sheet, thereby generating images on the recording sheet. Ink jet printing processes are well known, and are described in, for example, U.S. Pat. No. 4,601,777, U.S. Pat. No. 4,251,824, U.S. Pat. No. 4,410,899, U.S. Pat. No. 4,412,224, and U.S. Pat. No. 4,532,530, the disclosures of each of which are totally incorporated herein by reference. In a particularly preferred embodiment, the printing apparatus employs a thermal ink jet process wherein the ink in the nozzles is selectively heated in an imagewise pattern, thereby causing droplets of the ink to be ejected in imagewise pattern. In another particularly preferred embodiment, the printing apparatus employs an acoustic ink jet process wherein droplets of the ink are caused to be ejected in imagewise pattern by acoustic beams.

The recording sheets of the present invention can also be used in any other printing or imaging process, such as printing with pen plotters, handwriting with ink pens, offset printing processes, or the like, provided that the ink employed to form the image is compatible with the ink receiving layer of the recording sheet.

Specific embodiments of the invention will now be described in detail. These examples are intended to be illustrative, and the invention is not limited to the materials, conditions, or process parameters set forth in these embodiments. All parts and percentages are by weight unless otherwise indicated.

EXAMPLE I

Preparation of Poly(Ethylene-Vinyl Acetate) in Benzene Followed by Alkaline Hydrolysis to Poly (Ethylene-Vinyl Acetate-Vinyl Alcohol)

Vinyl acetate (97 grams, freshly distilled under argon to remove inhibitor), benzene (100 grams), and azobisisobutyronitrile (1 gram) were added to a 600 milliliter Parr pressure reaction vessel, which was then pressurized and purged three times with argon. The reactor was then pressured to between 210 and 220 pounds per square inch (gauge) with ethylene. Thereafter, the stirred reactor was heated in a silicone oil bath at 135° C. for 16 hours. During this time, about 90 pounds per square inch (gauge) of ethylene was consumed. The reaction mixture was subsequently transferred to a 1 liter flask and taken to dryness with a rotary evaporator and a vacuum pump. The residue was 47 grams of an ethylene-vinyl acetate copolymer with $M_w$=48,960, $M_n$=15,140, and $M_{peak}$=30,080. A solution of 28 grams of the ethylene-vinyl acetate copolymer in 200 grams of methanol was then boiled at reflux with mechanical stirring for 10 minutes with 5 milliliters of a 40 weight percent solution of benzyltrimethylammonium hydroxide in methanol in a silicone oil bath at 72 ±3° C. Reflux was continued for an additional 30 minutes, for a total of 40 minutes before heating was discontinued and the reaction temperature allowed to return to 25° C. The resulting precipitate was filtered off and dried to yield 25 grams of poly(ethylene-vinyl acetate-vinyl alcohol) terpolymer. Because solvent peaks overlapped with resin peaks, it was not possible to determine an exact resin composition. The approximate resin composition was believed to be about 10 mole percent ethylene repeat units, about 10 mole percent vinyl acetate repeat units, and about 80 mole percent vinyl alcohol repeat units. It is believed that some benzene may also have been incorporated into the polymer chain.

A 17 weight percent solids solution of the terpolymer thus prepared was made by heating the polymer (5 grams) with water (20 grams) and ethanol (5 grams). The solution was pressure filtered through a 0.47 micron perfluoro-membrane (Aldrich) to yield a clear, water-white solution. The solution thus prepared was draw-bar coated onto a MYLAR® transparent substrate and heated with a hair dryer to dryness to produce a 10 micron dried coating thickness.

EXAMPLE II

Preparation of Poly(Ethylene-Vinyl Acetate) in Cyclohexane, Followed by Alkaline Hydrolysis to Poly(Ethylene-Vinyl Acetate-Vinyl Alcohol)

Vinyl acetate (97 grams, freshly distilled under argon to remove inhibitor), cyclohexane (100 grams), and azobisisobutyronitrile (1 gram) were added to a 600 milliliter Parr pressure reaction vessel, which was then pressurized and purged three times with argon. The reactor was then pressured to between 210 and 220 pounds per square inch (gauge) with ethylene. Thereafter, the stirred reactor was heated in a silicone oil bath at 135° C. The pressure in the vessel rapidly increased to 600 pounds per square inch (gauge), and then dropped to 400 pounds per square inch (Gauge) after 16 hours at 135° C. The reaction mixture was subsequently transferred to a 1 liter flask and taken to dryness with a rotary evaporator and a vacuum pump. The residue was 54.8 grams of an ethylene-vinyl acetate copolymer with $M_w$=23,250, $M_n$=7,780, and $M_{peak}$=16,190. A solution of 54 grams of the ethylene-vinyl acetate copolymer in 500 grams of methanol was then boiled at reflux with mechanical stirring for 60 minutes with 5 milliliters of a 40 weight percent solution of benzyltrimethylammonium hydroxide in methanol in a silicone oil bath at 72±3° C. The reaction temperature was then allowed to return to 25° C. The resulting cloudy suspension was dried to yield a poly (ethylene-vinyl acetate-vinyl alcohol) terpolymer. The resin contained about 2 mole percent ethylene repeat units, about 78 mole percent vinyl alcohol repeat units, and about 20 mole percent vinyl acetate repeat units.

A 17 weight percent solids solution of the terpolymer thus prepared was made by heating the polymer (5 grams) with water (20 grams) and ethanol (5 grams). The solution was pressure filtered through a 0.47 micron perfluoro-membrane (Aldrich) to yield a clear, water-white solution. The solution thus prepared was draw-bar coated onto a MYLAR® transparent substrate and heated with a hair dryer to dryness to produce a 10 micron dried coating thickness.

EXAMPLE III

Preparation of Poly(Ethylene-Vinyl Acetate) in Water, Followed by Alkaline Hydrolysis to Poly(Ethylene-Vinyl Acetate-Vinyl Alcohol)

Vinyl acetate (60 grams, freshly distilled under argon to remove inhibitor), water (100 grams), sodium dodecylsulfate (0.6 gram), potassium hydrogen phosphate (0.6 gram), and azobisisobutyronitrile (0.5 gram) were added to a 600 milliliter Parr pressure reaction vessel, which was then pressurized and purged three times with argon. The reactor was then pressured to 200 pounds per square inch (gauge) with ethylene. Thereafter, the stirred reactor was heated in a silicone oil bath at 100° C. and maintained at that temperature for 8 hours, followed by cooling to 25° C. The pressure in the vessel at 25° C. was 120 pounds per square inch, and 80 pounds per square inch (gauge) of ethylene were consumed during the reaction. The resulting polymer was collected by filtration and vacuum dried to yield 50 grams of an ethylene-vinyl acetate copolymer. A solution of 25 grams of the ethylene-vinyl acetate copolymer in 196.4 grams (250 milliliters) of methanol was then boiled at reflux with mechanical stirring for 8 minutes with 10 milliliters of a 5 weight percent solution of sodium methoxide in methanol in a silicone oil bath at 72±3° C. The reaction temperature was then allowed to return to 25° C. The resulting precipitate was filtered and dried to yield 12.5 grams of a poly(ethylene-vinyl acetate-vinyl alcohol) terpolymer. The resin contained less than about 2 mole percent ethylene repeat units, from about 83 to about 85 mole percent vinyl alcohol repeat units, and from about 13 to about 15 mole percent vinyl acetate repeat units.

A 12 weight percent solids solution of the terpolymer thus prepared was made by heating the polymer (10 grams) with water (70 grams) and methanol (5 grams). The solution was pressure filtered through a 0.47 micron perfluoro-membrane (Aldrich) to yield a clear, water-white solution. The solution thus prepared was draw-bar coated onto a MYLAR® transparent substrate and heated with a hair dryer to dryness, producing a 10 micron dried coating thickness.

EXAMPLE IV

Preparation of Poly(Ethylene-Vinyl Acetate) in Water, Followed by Alkaline Hydrolysis to Poly (Ethylene-Vinyl Acetate-Vinyl Alcohol)

Vinyl acetate (60 grams, freshly distilled under argon to remove inhibitor), water (100 grams), sodium dodecylsulfate (0.6 gram), potassium hydrogen phosphate (0.6 gram), and azobisisobutyronitrile (0.5 gram) were added to a 600 milliliter Parr pressure reaction vessel, which was then pressurized and purged three times with argon. The reactor was then pressured to 120 pounds per square inch (gauge) with ethylene and 80 pounds per square inch with argon. Thereafter, the stirred reactor was heated in a silicone oil bath at 50° C. and maintained at that temperature for 8 hours, followed by cooling to 25° C. The pressure in the vessel at 25° C. was 160 pounds per square inch, and 40 pounds per square inch (gauge) of ethylene were consumed during the reaction. The resulting polymer was collected by filtration and vacuum dried to yield 48.6 grams of an ethylene-vinyl acetate copolymer. A solution of 25 grams of the ethylene-vinyl acetate copolymer in 275.6 grams (300 milliliters) of methanol was then boiled at reflux with mechanical stirring for 6 minutes with 15 milliliters of a 5 weight percent solution of sodium methoxide in methanol in a silicone oil bath at 72±3° C. The reaction temperature was then allowed to return to 25° C. The resulting precipitate was filtered and dried to yield 13.59 grams of a poly(ethylene-vinyl acetate-vinyl alcohol) terpolymer. The resin contained less than about 2 mole percent ethylene repeat units, from about 85 to about 88 mole percent vinyl alcohol repeat units, and from about 10 to about 13 mole percent vinyl acetate repeat units.

A solution of the terpolymer thus prepared was made by heating the polymer (10 grams) with water (90 grams). The solution was pressure filtered through a 0.47 micron perfluoro-membrane (Aldrich) to yield a clear, water-white solution. The solution thus prepared was draw-bar coated onto a MYLAR® transparent substrate and heated with a hair dryer to dryness, producing a 10 micron dried coating thickness.

EXAMPLE V

Preparatilon of Poly(Ethylene-Vinyl Acetate) in Benzene Followed by Alkaline Hydrolysis to Poly (Ethylene-Vinyl Acetate-Vinyl Alcohol)

Vinyl acetate (97 grams, freshly distilled under argon to remove inhibitor), benzene (100 grams), and azobisisobutyronitrile (1 gram) were added to a 600 milliliter Parr pressure reaction vessel, which was then pressurized and purged three times with argon. The reactor was then pressured to between 210 and 220 pounds per square inch (gauge) with ethylene. Thereafter, the stirred reactor was heated in a silicone oil bath at 135° C. for 16 hours. During this time, about 90 pounds per square inch (gauge) of ethylene was consumed. The reaction mixture was subsequently transferred to a 1 liter flask and taken to dryness with a rotary evaporator and a vacuum pump. The residue was 47 grams of an ethylene-vinyl acetate copolymer with $M_w$=48,960, $M_n$=5,140, and $M_{peak}$=30,080. A solution of 10 grams of the ethylene vinyl acetate copolymer in 79.2 grams of methanol was then boiled at reflux with mechanical stirring for 10 minutes with 4 grams of a 5 weight percent solution of sodium methoxide in methanol in a silicone oil bath at 72±3° C. The reaction temperature was then allowed to return to 25° C. The resulting precipitate was filtered off and dried to yield 3.39 grams of poly(ethylene-vinyl acetate-vinyl alcohol) terpolymer. The resin contained from about 5 to about 10 mole percent ethylene repeat units, from about 75 to about 80 mole percent vinyl alcohol repeat units, and from about 15 to about 20 mole percent vinyl acetate repeat units.

A solution of the terpolymer thus prepared was made by heating the polymer (3.39 grams) with water (20 grams) and ethanol (5 grams). The solution was pressure filtered through a 0.47 micron perfluoro-membrane (Aldrich) to yield a clear, water-white solution. The solution thus prepared was draw-bar coated onto a MYLAR® transparent substrate and heated with a hair dryer to dryness, producing a 10 micron dried coating thickness.

EXAMPLE VI

Preparation of Poly(Ethylene-Vinyl Acetate) in Water, Followed by Alkaline Hydrolysis to Poly (Ethylene-Vinyl Acetate-Vinyl Alcohol)

Vinyl acetate (60 grams, freshly distilled under argon to remove inhibitor), water (100 grams), sodium dodecylsulfate (0.6 gram), potassium hydrogen phosphate (0.6 gram), and azobisisobutyronitrile (0.5 gram) were added to a 600 milliliter Parr pressure reaction vessel, which was then pressurized and purged three times with argon. The reactor was then pressured to 120 pounds per square inch (gauge) with ethylene and 80 pounds per square inch with argon. Thereafter, the stirred reactor was heated in a silicone oil bath at 50° C. and maintained at that temperature for 8 hours, followed by cooling to 25° C. The pressure in the vessel at 25° C. was 160 pounds per square inch, and 40 pounds per square inch (gauge) of ethylene were consumed during the reaction. The resulting polymer was collected by filtration and vacuum dried to yield 48.6 grams of an ethylene-vinyl acetate copolymer. A solution of 20 grams of the ethylene-vinyl acetate copolymer in 250 grams of methanol was then boiled at reflux with mechanical stirring for 10 minutes with 2 grams of a 40 weight percent solution of benzyltrimethylammonium hydroxide in methanol in a silicone oil bath at 72±3° C. The reaction temperature was then allowed to return to 25° C. The resulting precipitate was filtered and dried to yield 10.5 grams of a poly(ethylene-vinyl acetate-vinyl alcohol) terpolymer. The resin contained about 4 mole percent ethylene repeat units, about 76 mole percent vinyl alcohol repeat units, and about 20 mole percent vinyl acetate repeat units.

A solution of the terpolymer thus prepared was made by heating the polymer (10 grams) with water (90 grams). The solution was pressure filtered through a 0.47 micron perfluoromembrane (Aldrich) to yield a clear, water-white solution. The solution thus prepared was draw-bar coated onto a MYLAR® transparent substrate and heated with a hair dryer to dryness, producing a 10 micron dried coating thickness.

EXAMPLE VII

Preparation of Poly(Ethylene-Vinyl Acetate) in Benzene Followed by Alkaline Hydrolysis to Poly (Ethylene-Vinyl Acetate-Vinyl Alcohol)

Vinyl acetate (97 grams, freshly distilled under argon to remove inhibitor), benzene (100 grams), and azobisisobutyronitrile (1 gram) were added to a 600 milliliter Parr pressure reaction vessel, which was then pressurized and purged three times with argon. The reactor was then pressured to 320 pounds per square inch (gauge) with ethylene. Thereafter, the stirred reactor was heated in a silicone oil bath at 135° C. for 24 hours. During this time, about 100 pounds per square inch (gauge) of ethylene was consumed. The reaction mixture was subsequently transferred to a 1 liter flask and taken to dryness with a rotary evaporator and a vacuum pump. The residue was 42 grams of an ethylene-vinyl acetate copolymer. A solution of 21 grams of the ethylene-vinyl acetate copolymer in 150 grams of methanol was then boiled at reflux with mechanical stirring for 60 minutes with 8 grams of a 40 weight percent solution of benzyltrimethylammonium hydroxide in methanol in a silicone oil bath at 72±3° C. The reaction temperature was then allowed to return to 25° C. The resulting precipitate was filtered off and dried to yield a poly(ethylene-vinyl acetate-vinyl alcohol) terpolymer. The resin contained about 3 mole percent ethylene repeat units, about 77 mole percent vinyl alcohol repeat units, and about 20 mole percent vinyl acetate repeat units.

A solution of the terpolymer thus prepared was made by heating the polymer (10 grams) with water (40 grams) and ethanol (10 grams). The solution was pressure filtered through a 0.47 micron perfluoro-membrane (Aldrich) to yield a clear, water-white solution. The solution thus prepared was draw-bar coated onto a MYLAR® transparent substrate and heated with a hair dryer to dryness, producing a 10 micron dried coating thickness.

EXAMPLE VIII

Print Testing

The transparent recording sheets prepared in Examples I, II, III, IV, V, and VII were each incorporated into a thermal ink jet test fixture equipped with four print bars, each capable of printing at 600 dots per inch, in a full width array configuration, and equipped with a microwave unit for drying of the images. Multicolored solid-area images were generated thereon with black, yellow, cyan, and magenta inks. The black ink comprised:

17 percent by weight BASF X-34 black dye (containing 34 percent by weight dye solids)(BASF);

13 percent by weight Direct Red 227 sodium salt magenta dye (containing 10 percent by weight dye solids) (Tricon Colors);

20 percent by weight sulfolane (solution containing 95 percent by weight sulfolane and 5 percent by weight water)(Phillips);

6 percent by weight trimethylolpropane (Aldrich);

1.25 percent by weight ammonium formate (Aldrich);

0.05 percent by weight polyethylene oxide (molecular weight 18,500)(Polysciences);

0.05 percent by weight DOWICIL 150/200 biocide (Dow Chemical); and 52.65 percent by weight deionized water.

The black ink was prepared by simple mixing of the ingredients, followed by filtering through a 1.2 micron Gelman Absolife polypropylene capsule filter using a Yamada diaphragm pump (Model #NDP-5FPT). The ink exhibited a viscosity of 2.11 centipoise at 25° C., a surface tension of 52.9 dynes per centimeter, a pH of 7.45 at 21.8° C., and a conductivity of 14.02 millimhos per centimeter. The yellow ink comprised:

27 percent by weight PROJET YELLOW 1G yellow dye solution (containing 7.5 percent by weight dye solids) (Zeneca Colors);

20 percent by weight Acid Yellow 17 yellow dye (containing 10 percent by weight dye solids)(Tricon Colors);

15.75 percent by weight sulfolane (solution containing 95 percent by weight sulfolane and 5 percent by weight water)(Phillips);

13 percent by weight acetylethanolamine (Aldrich);

12 percent by weight butyl carbitol (Van Waters & Rogers);

2 percent by weight ammonium bromide (Morre-Tec Industries);

0.05 percent by weight polyethylene oxide (molecular weight 18,500)(Polysciences);

0.05 percent by weight DOWICIL 150/200 biocide (Dow Chemical);

0.03 percent by weight ammonium hydroxide (Corco); and 10.12 percent by weight deionized water.

The yellow ink was prepared by simple mixing of the ingredients. The ink exhibited a viscosity of 3.42 centipoise at 25° C., a surface tension of 37.1 dynes per centimeter, a pH of 6.81 at 19.3° C., and a conductivity of 11.53 millimhos per centimeter. The magenta ink comprised:

24.73 percent by weight PROJET MAGENTA Dye solution (containing 10 percent by weight dye solids) (Zeneca Colors);

5.93 percent by weight Acid Red 52 dye solution (containing 10 percent by weight dye solids)(Tricon Colors);

9.89 percent by weight butyl carbitol (Van Waters & Rogers);

1.98 percent by weight cyclohexylpyrrolidinone;

14.84 percent by weight sulfolane (solution containing 95 percent by weight sulfolane and 5 percent by weight water)(Phillips);

12.86 percent by weight acetylethanolamine (Aldrich);

3.0 percent by weight ammonium bromide;

0.049 percent by weight DOWICIL 150/200 biocide (Dow Chemical);

0.049 percent by weight polyethylene oxide (molecular weight 18,500)(Polysciences); and 26.67 percent by weight deionized water.

The magenta ink was prepared by simple mixing of the ingredients. The ink exhibited a viscosity of 3.17 centipoise at 25° C., a surface tension of 40.0 dynes per centimeter, a pH of 7.01 at 25° C., and a conductivity of 16.9 millimhos per centimeter. The cyan ink comprised:

32.65 percent by weight PROJET CYAN dye solution (containing 10 percent by weight dye solids (Zeneca Colors);

9.33 percent by weight butyl carbitol (Van Waters & Rogers);

1.87 percent by weight cyclohexylpyrrolidinone;

9.33 percent by weight sulfolane (solution containing 95 percent by weight sulfolane and 5 percent by weight water)(Phillips);

16.0 percent by weight acetylethanolamine (Aldrich);

2.33 percent by weight ammonium bromide;

0.047 percent by weight DOWICIL 150/200 biocide (Dow Chemical);

0.047 percent by weight polyethylene oxide (molecular weight 18,500)(Polysciences); and 28.36 percent by weight deionized water.

The cyan ink was prepared by simple mixing of the ingredients. The ink exhibited a viscosity of 3.19 centipoise at 25° C., a surface tension of 39.5 dynes per centimeter, a pH of 7.02 at 25° C., and a conductivity of 13.0 millimhos per centimeter. The quality of the prints thus generated was rated on a scale of 1 to 10. The metric used to evaluate the prints was copy quality as subjectively determined visually in terms of image defects and lack thereof. Image defects for mild coalescence were generally in the form of pullback from printing borders. The results were as follows:

| Example | Black | Color |
|---|---|---|
| I | 2; slight pullback | 2; slight pullback |
| II | 10; severe coalescence | 1; no pullback |
| III | 3; slight pullback | 5; moderate pullback |
| IV | 2; slight pullback | 7; moderate to severe pullback |
| V | 5; moderate pullback | 1; no pullback |
| VII | 8; severe pullback | 1; no pullback |

As the results indicate, the recording sheets coated with poly(ethylene-vinyl alcohol-vinyl acetate) terpolymers containing high amounts of vinyl alcohol caused the colored inks to bead, and the recording sheets coated with poly (ethylene-vinyl alcohol-vinyl acetate) terpolymers containing high amounts of vinyl acetate caused the black ink to coalesce. The poly(ethylene-vinyl alcohol-vinyl acetate) terpolymer used in Example I had relative amounts of monomers within the scope of the instant invention, and good copy quality was obtained for both the colored inks and the black inks, which were of markedly different surface tensions. The poly(ethylene-vinyl alcohol-vinyl acetate) terpolymer used in Example II contained less than 2 mole percent ethylene, 75 to 80 mole percent vinyl alcohol, and about 20 mole percent vinyl acetate, resulting in severe black ink coalescence. The poly(ethylene-vinyl alcohol-vinyl acetate) terpolymer used in Example III contained less than 2 mole percent ethylene, 82 to 87 mole percent vinyl alcohol, and 13 to 15 mole percent vinyl acetate, resulting in pullback for the colored inks. The poly(ethylene-vinyl alcohol-vinyl acetate) terpolymer used in Example IV contained less than 2 mole percent ethylene, from 85 to 90 mole percent vinyl alcohol, and from 10 to 13 mole percent vinyl acetate, resulting in moderate to severe pullback of the colored inks. The poly(ethylene-vinyl alcohol-vinyl acetate) terpolymer used in Example V contained from 5 to 10 mole percent ethylene, from 75 to 80 mole percent vinyl alcohol, and from 15 to 20 mole percent vinyl acetate, resulting in only moderate pullback of the black ink and excellent image quality for the colored inks. The poly(ethylene-vinyl alcohol-vinyl acetate) terpolymer used in Example VII was comparable in results to that of Example II. As these results indicate, higher mole percentages of vinyl acetate tend to lead to better print quality of images made with the color inks and higher mole percentages of vinyl alcohol tend to lead to better print quality of images made with the black ink. Ideal poly(ethylene-vinyl alcohol-vinyl acetate) terpolymers contain ethylene repeat units in an amount of from about 5 to about 20 mole percent, vinyl alcohol repeat units in an amount of from about 70 to about 85 mole percent, and vinyl acetate repeat units in an amount of from about 5 to about 20 mole percent. Increasing the molecular weight of the terpolymer also enabled high quality black images with somewhat reduced relative amounts of vinyl alcohol monomers.

Other embodiments and modifications of the present invention may occur to those of ordinary skill in the art subsequent to a review of the information presented herein; these embodiments and modifications, as well as equivalents thereof, are also included within the scope of this invention.

What is claimed is:

1. An imaged recording sheet which comprises a recording sheet comprising a substrate and an image-receiving coating situated on at least one surface of the substrate, said image-receiving coating being suitable for receiving high quality images of an aqueous ink, said image-receiving coating comprising a poly(ethylene-vinyl alcohol-vinyl acetate) terpolymer, said terpolymer containing ethylene repeat units in an amount of from about 5 to about 20 mole percent vinyl alcohol repeat units in an amount of from about 70 to about 85 mole percent, and vinyl acetate repeat units in an amount of from about 5 to about 20 mole percent, wherein said image receiving coating contains an image applied from an aqueous ink.

2. An imaged recording sheet according to claim 1 wherein the substrate is opaque.

3. An imaged recording sheet according to claim 1 wherein the substrate is transparent.

4. A recording sheet which comprises a substrate and an image-receiving coating situated on at least one surface of the substrate, said image-receiving coating being suitable for receiving high quality images of an aqueous ink, said image-receiving coating comprising a poly(ethylene-vinyl alcohol-vinyl acetate) terpolymer, said terpolymer containing ethylene repeat units in an amount of from about 5 to about 20 mole percent, vinyl alcohol repeat units in an amount of from about 70 to about 85 mole percent, and vinyl acetate repeat units in an amount of from about 5 to about 20 mole percent, said substrate comprising a polyester, a polyethylene naphthalate, a polycarbonate, a polysulfone, a polyether sulfone, cellulose triacetate, a polyvinyl chloride, a polyvinyl fluoride, a polyimide, or a paper.

5. A recording sheet according to claim 4 wherein the terpolymer contains ethylene repeat units in an amount of from about 10 to about 13 mole, percent vinyl alcohol repeat units in an amount of from about 75 to about 80 mole percent, and vinyl acetate repeat units in an amount of from about 10 to about 12 mole percent.

6. A recording sheet according to claim 4 wherein high quality two-colored images can be produced on the image receiving coating of the recording sheet by a first ink having a first color and a first surface tension and by a second ink having a second color and a second surface tension, wherein the first color is not the same as the second color, and wherein the difference between the first surface tension and the second surface tension is from about 10 to about 25 dynes per centimeter.

7. A recording sheet according to claim 4 wherein high quality two-colored images can be produced on the image receiving coating of the recording sheet by a first ink having a first color and a first surface tension, and by a second ink having a second color and a second surface tension, wherein the first color is not the same as the second color, and wherein the first surface tension is from about 45 to about 55 dynes per centimeter and the second surface tension is from about 30 to about 40 dynes per centimeter.

8. A recording sheet according to claim 4 wherein the image receiving coating layer is present on the substrate in an amount of from about 2.5 to about 25 grams per square meter.

9. A recording sheet according to claim 4 wherein the image receiving coating layer is present on the substrate in a thickness of from about 1 to about 25 microns.

10. A recording sheet according to claim 4 wherein high quality two-colored images can be produced on the image receiving coating of the recording sheet by a first ink having a first color and by a second ink having a second color, wherein the first color is not the same as the second color, wherein the first ink comprises a water soluble anionic dye, water, sulfolane in an amount of from about 8 to about 20 percent by weight, butyl carbitol in an amount of from about 8 to about 15 percent by weight, and acetylethanolamine in an amount of from about 10 to about 20 percent by weight, and wherein the second ink comprises a water soluble anionic dye, water, and sulfolane in an amount of from about 15 to about 25 percent by weight.

11. An imaged recording sheet according to claim 1 wherein high quality two-colored images are contained on the image receiving coating of the recording sheet, said images being generated by a first ink having a first color and a first surface tension and by a second ink having a second color and a second surface tension, wherein the first color is not the same as the second color, and wherein the difference between the first surface tension and the second surface tension is from about 10 to about 25 dynes per centimeter.

12. An imaged recording sheet according to claim 1 wherein high quality two-colored images are contained on the image receiving coating of the recording sheet, said images being generated by a first ink having a first color and a first surface tension and by a second ink having a second color and a second surface tension, wherein the first color is not the same as the second color, and wherein the first surface tension is from about 45 to about 55 dynes per centimeter and the second surface tension is from about 30 to about 40 dynes per centimeter.

13. An imaged recording sheet according to claim 1 wherein high quality two-colored images are contained on the image receiving coating of the recording sheet, said images being generated by a first ink having a first color and by a second ink having a second color, wherein the first color is not the same as the second color, wherein the first ink comprises a water soluble anionic dye, water, sulfolane in an amount of from about 8 to about 20 percent by weight, butyl carbitol in an amount of from about 8 to about 15 percent by weight, and acetylethanolamine in an amount of from about 10 to about 20 percent by weight, and wherein the second ink comprises a water soluble anionic dye, water, and sulfolane in an amount of from about 15 to about 25 percent by weight.

14. A process which comprises applying an aqueous recording liquid in an imagewise pattern to a recording sheet which comprises a substrate and an image-receiving coating situated on at least one surface of the substrate, said image-receiving coating being suitable for receiving images of an aqueous ink, said image-receiving coating comprising a poly(ethylene-vinyl alcohol-vinyl acetate) terpolymer, said terpolymer containing ethylene repeat units in an amount of from about 5 to about 20 mole percent, vinyl alcohol repeat units in an amount of from about 70 to about 85 mole percent, and vinyl acetate repeat units in an amount of from about 5 to about 20 mole percent.

15. A process according to claim 14 wherein a first ink having a first color and a first surface tension and a second ink having a second color and a second surface tension are both applied to the recording sheet in an imagewise pattern, wherein the first color is not the same as the second color, and wherein the difference between the first surface tension and the second surface tension from about 10 to about 25 dynes per centimeter.

16. A process according to claim 14 wherein a first ink having a first color and a first surface tension and a second ink having a second color and a second surface tension are both applied to the recording sheet in an imagewise pattern, wherein the first color is not the same as the second color, and wherein the first surface tension is from about 45 to about 55 dynes per centimeter and the second surface tension is from about 30 to about 40 dynes per centimeter.

17. A process according to claim 14 wherein a first ink having a first color and a second ink having a second color are both applied to the recording sheet in an imagewise pattern, wherein the first color is not the same as the second color, wherein the first ink comprises a water soluble anionic dye, water, sulfolane in an amount of from about 8 to about 20 percent by weight, butyl carbitol in an amount of from about 8 to about 15 percent by weight, and acetylethanolamine in an amount of from about 10 to about 20 percent by weight, and wherein the second ink comprises a water soluble anionic dye, water, and sulfolane in an amount of from about 15 to about 25 percent by weight.

18. A printing process which comprises (1) incorporating into an ink jet printing apparatus containing an aqueous ink a recording sheet which comprises a substrate and an image-receiving coating situated on at least one surface of the substrate, said image-receiving coating being suitable for receiving images of an aqueous ink, said image-receiving coating comprising a poly(ethylene-vinyl alcohol-vinyl acetate) terpolymer, said terpolymer containing ethylene repeat units in an amount of from about 5 to about 20 mole percent, vinyl alcohol repeat units in an amount of from about 70 to about 85 mole percent, and vinyl acetate repeat units in an amount of from about 5 to about 20 mole percent, and (2) causing droplets of the ink to be ejected in an imagewise pattern onto the recording sheet, thereby generating images on the recording sheet.

19. A process according to claim 18 wherein a first ink having a first color and a first surface tension and a second ink having a second color and a second surface tension are both applied to the recording sheet in an imagewise pattern, wherein the first color is not the same as the second color, and wherein the difference between the first surface tension and the second surface tension is from about 10 to about 25 dynes per centimeter.

20. A process according to claim 18 wherein a first ink having a first color and a first surface tension and a second ink having a second color and a second surface tension are both applied to the recording sheet in an imagewise pattern, wherein the first color is not the same as the second color, and wherein the first surface tension is from about 45 to about 55 dynes per centimeter and the second surface tension is from about 30 to about 40 dynes per centimeter.

21. A process according to claim 18 wherein a first ink having a first color and a second ink having a second color are both applied to the recording sheet in an imagewise pattern, wherein the first color is not the same as the second color, wherein the first ink comprises a water soluble anionic dye, water, sulfolane in an amount of from about 8 to about 20 percent by weight, butyl carbitol in an amount of from about 8 to about 15 percent by weight, and acetylethanolamine in an amount of from about 10 to about 20 percent by weight, and wherein the second ink comprises a water soluble anionic dye, water, and sulfolane in an amount of from about 15 to about 25 percent by weight.

* * * * *